United States Patent
Kanou et al.

(10) Patent No.: US 9,326,395 B2
(45) Date of Patent: Apr. 26, 2016

(54) ELECTRICAL CONNECTION BOX

(71) Applicant: SUMITOMO WIRING SYSTEMS, LTD., Yokkaichi, Mie (JP)

(72) Inventors: Takehiro Kanou, Yokkaichi (JP); Satoru Chaen, Yokkaichi (JP); Shuka Chen, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 14/519,851

(22) Filed: Oct. 21, 2014

(65) Prior Publication Data

US 2015/0132977 A1 May 14, 2015

(30) Foreign Application Priority Data

Nov. 11, 2013 (JP) ................................. 2013-233020

(51) Int. Cl.
*H01R 13/64* (2006.01)
*H05K 5/00* (2006.01)
*H01R 12/72* (2011.01)

(52) U.S. Cl.
CPC ............ *H05K 5/0069* (2013.01); *H01R 12/725* (2013.01)

(58) Field of Classification Search
CPC .......................... H01R 13/6315; H01R 23/682
USPC ..................... 439/247, 248, 326, 77
See application file for complete search history.

(56) References Cited

U.S. PATENT DOCUMENTS

| | | | |
|---|---|---|---|
| 7,192,310 B1* | 3/2007 | Chao | H01R 4/2433 439/607.45 |
| 7,476,118 B2* | 1/2009 | Amidon | H01R 13/6275 439/352 |
| 8,897,031 B2* | 11/2014 | Kanou | H05K 5/0013 174/50 |
| 2010/0236825 A1* | 9/2010 | Nagatomo | H05K 7/026 174/520 |
| 2014/0118986 A1* | 5/2014 | Suzuki | H05K 5/0056 361/821 |
| 2015/0132977 A1* | 5/2015 | Kanou | H05K 5/0069 439/78 |

FOREIGN PATENT DOCUMENTS

JP      A-2005-136154      5/2005

* cited by examiner

*Primary Examiner* — Phuonchi T Nguyen
(74) *Attorney, Agent, or Firm* — Oliff PLC

(57) ABSTRACT

An electrical connection box is provided in which a printed circuit board provided with a lateral connection-type connector is housed in a case, and a cover is attached to the case, and this electrical connection box has a novel structure in which a reduction in size and manufacturing cost can be achieved while still reliably protecting the connector. A surface mount-type connector is provided on a printed circuit board as the lateral connection-type connector, and the case and the cover are provided with incorrect-connection-prevention projection portions that, in the case where the cover is brought close to the case upside down relative to the proper orientation, prevent incorrect attachment of the cover by abutting against each other before the cover abuts against the connector.

12 Claims, 5 Drawing Sheets

ELECTRICAL CONNECTION BOX

This application claims priority to Japanese Patent Application No. JP 2013-233020, which was filed on Nov. 11, 2013. The priority document is incorporated herein by reference in its entirety.

BACKGROUND

Various electrical connection boxes have been provided in automobiles and the like, such as a CAN (Controller Area Network) gateway ECU for connecting sub-networks in a CAN and performing protocol conversion, and a junction box for distributing power from a battery to various electrical parts. One type of such an electrical connection box has a structure in which a printed circuit board provided with a lateral connection-type connector is housed in a case, and the opening of the case is blocked by attaching a cover through which the connector is inserted, as disclosed in JP 2005-136154A (Patent Document 1).

The number of electrical parts installed in automobiles has been increasing in recent years. In response to this, the number of electrical connection boxes such as ECUs provided in automobiles has been increasing as well, and there is demand for further downsizing and reduction in manufacturing cost.

However, with an electrical connection box such as that disclosed in Patent Document 1, the lateral connection-type connector is fixed to the printed circuit board using bolts in order to protect the lateral connection-type connector. This has led to an increase in the number of parts, and also led to an increase in assembly man-hours due to tightening the bolts, which has caused of an increase in manufacturing cost. Also, bolt fixing portions need to be formed in the connector housing for bolt fixing, and this has led to an increase in the size of the connector, which has then caused an increase in the size of the electrical connection box.

JP 2005-136154A is Patent Document 1 (discussed above).

SUMMARY

An object herein is to provide an electrical connection box in which a printed circuit board provided with a lateral connection-type connector is housed in a case, and a cover is attached to the case, and this electrical connection box has a novel structure in which reduction in size and manufacturing cost can be achieved while still reliably protecting the connector.

A first aspect herein is an electrical connection box in which a printed circuit board provided with a lateral connection-type connector is inserted through an opening portion of a case and housed in the case, and in which a cover is attached to the opening portion of the case, the connector projecting outside the case through a through-hole formed in the cover, a surface mount-type connector being provided on the printed circuit board as the connector, and the case and the cover being provided with incorrect-connection-prevention projection portions that, in a case where the cover is brought close to the case upside down relative to a proper orientation, prevent incorrect attachment of the cover by abutting against each other before the cover abuts against the connector.

In the electrical connection box having the above structure, a surface mount-type connector is employed as the lateral connection-type connector provided on the printed circuit board. Accordingly, by merely the connection terminals of the connector being overlaid on the printed circuit board and soldered thereto, the housing of the connector can be fixed to the printed circuit board without requiring bolts or the like. As a result, it is possible to reduce the number of parts and reduce manufacturing cost, and because there is no need to form bolt fixing portions or the like on the housing, it is possible to reduce the size of the electrical connection box by reducing the size of the connector.

Note that the surface mount-type connector is fixed to the printed circuit board without using bolts as described above. For this reason, if the cover is brought close to the case upside down relative to the proper orientation for example, the cover will collide with the connector, and the portion where the connector is soldered to the printed circuit board will be subjected to a load, thus leading to contact failure or the like, and also causing the new problem of an inability to protect the connector.

In view of this, the case and the cover are provided with incorrect-connection-prevention projection portions that, if an attempt is made to attach the cover to the case in an incorrect orientation, prevent incorrect attachment of the cover by abutting against each other before the cover abuts against the connector. Accordingly, if an attempt is made to incorrectly attach the cover, it is possible to prevent collision between the cover and the connector, and it is possible to prevent the soldering portion of the connector from being subjected to a load. In this way, the connector can be reliably protected by reliably preventing collision between the cover and the connector due to incorrect attachment of the cover. Accordingly, for the first time it is possible for a surface mount-type connector to be employed in an electrical connection box having a structure in which the printed circuit board is inserted into the case and then the cover is attached, and it is possible to realize a reduction in size and manufacturing cost of the electrical connection box.

A second aspect is the first aspect wherein the incorrect-connection-prevention projection portions are respectively provided on the case and the cover on upper and lower sides with the connector therebetween.

According to this aspect, the connector can be more reliably protected by inhibiting the approach of the cover above and below the connector.

A third aspect is the second aspect wherein the incorrect-connection-prevention projection portion located on the upper side of the connector is formed on one of an inner face and an outer face of the case, and the incorrect-connection-prevention projection portion located on the lower side of the connector is formed on the other one of the inner face and the outer face of the case.

In this aspect, the incorrect-connection-prevention projection portion located on the upper side of the connector and the incorrect-connection-prevention projection portion located on the lower side of the connector are arranged separately inside and outside the case. Accordingly, even if an attempt is made to incorrectly connect the cover in an upside down orientation, the approach of the cover is effectively inhibited by the incorrect-connection-prevention projection portions on the cover and the case abutting against each other on the upper side and the lower side of the connector, whereas if the cover approaches in the proper orientation, interference between the incorrect-connection-prevention projection portion on the cover and the incorrect-connection-prevention projection portion on the case is avoided, and attachment can be performed smoothly.

A fourth aspect is any one of the first to third aspects wherein insertion of the printed circuit board in an inclined state is prevented by the incorrect-connection-prevention projection portion provided on an inner face of the case.

According to this aspect, insertion of the printed circuit board into the case in an inclined state can be prevented by the incorrect-connection-prevention projection portion on the case. In particular, it is possible to prevent the case where the printed circuit board is inserted into the case in an inclined state and the connector collides with the case, thus making it possible to further protect the connector. Accordingly, in addition to the effect of preventing incorrect attachment of the cover, the incorrect-connection-prevention projection portion on the case can also achieve an effect of preventing incorrect attachment of the printed circuit board.

A fifth aspect is any one of the first to fourth aspects wherein the incorrect-connection-prevention projection portion provided on the cover is formed on a lock piece of the cover for engagement with an engaging protrusion protruding on an outer face of the case.

In this aspect, the incorrect-connection-prevention projection portion of the cover is provided on a lock piece for engagement with the case, and thus if an attempt is made to attach the cover to the case in an incorrect orientation, the incorrect-connection-prevention projection portion on the lock piece abuts against the incorrect-connection-prevention projection portion on the case, thus reliably inhibiting movement of the lock piece, and it is therefore possible to more reliably inhibit incorrect attachment of the cover.

A surface mount-type connector is used as the lateral connection-type connector, and the case and the cover are provided with incorrect-connection-prevention projection portions that, if an attempt is made to attach the cover in an incorrect orientation, prevent incorrect attachment of the cover by abutting against each other before the cover abuts against the connector. Accordingly, it is possible to prevent collision between the cover and the connector in incorrect attachment of the cover, it is possible to employ a surface mount-type connector that does not require bolts or the like when fixed to the printed circuit board, and it is possible to realize a reduction in size and manufacturing cost of the electrical connection box.

DETAILED DESCRIPTION OF THE EMBODIMENTS

An embodiment will be described below with reference to the drawings.

Figure 1:
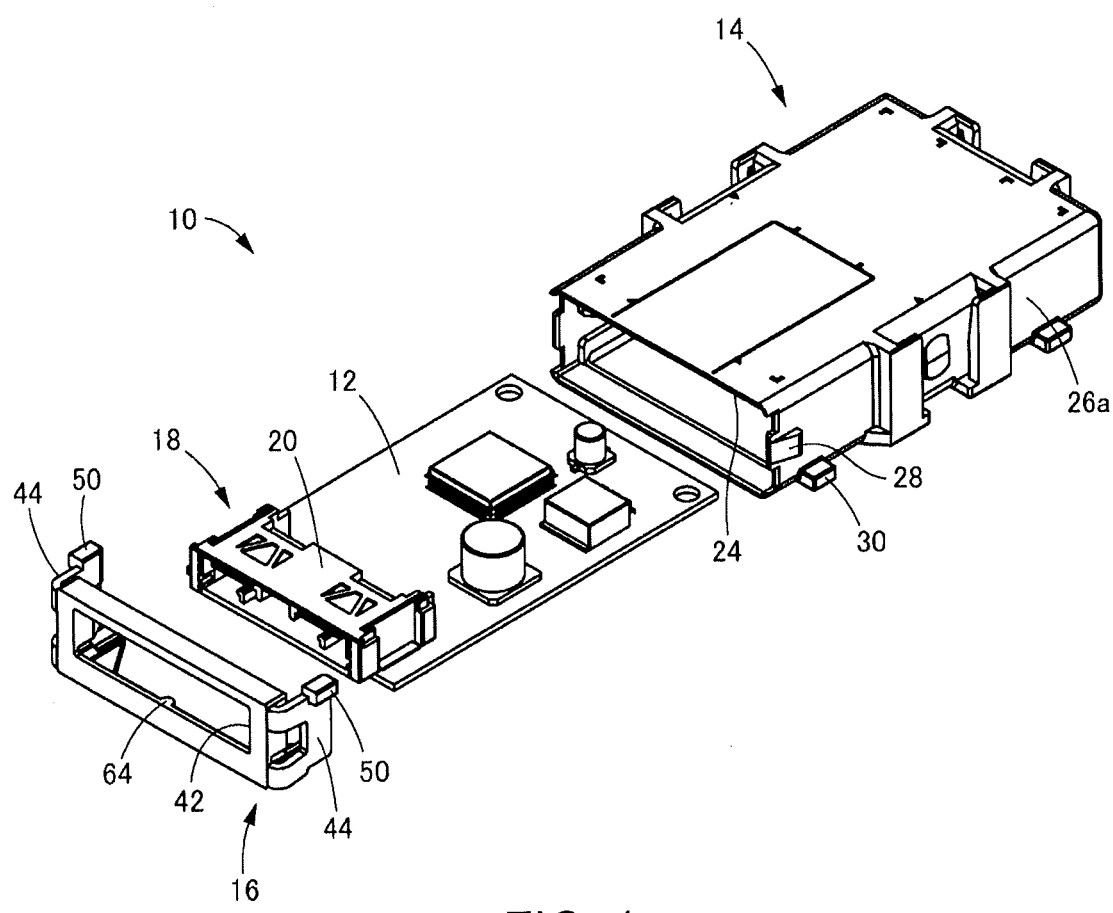
FIG. 1 is an exploded perspective view of an electrical connection box according to an embodiment.

First, FIG. 1 shows an electrical connection box 10 as an embodiment. The electrical connection box 10 is a CAN (Controller Area Network) gateway ECU used in a CAN in an automobile, and is configured so as to include a printed circuit board 12, a case 14, and a cover 16. Note that in the following description, the up-down (vertical) direction refers to the up-down direction in later-described FIG. 2, and the front-back direction refers to the left-right direction in later-described FIG. 3.

The printed circuit board 12 is shaped as a plate having an approximately elongated rectangle shape. A lateral connection-type connector ("connector" hereinafter) 18 is provided on the printed circuit board 12 in one of the outer peripheral portions that extend in the widthwise direction. The connector 18 is a surface mount-type connector, and as is clear from later-described FIG. 6, the end portions of connection terminals 22 projecting from a housing 20 are overlaid on the surface of the printed circuit board 12 and soldered thereto. The housing 20 of the connector 18 is fixed by the connection terminals 22 being soldered to the printed circuit board 12, and thus is fixed to the printed circuit board 12 without the use of bolts or the like. This connector 18 is provided on the outer peripheral portion of the printed circuit board 12 with an opening to the lateral side of the printed circuit board 12.

Figure 2:
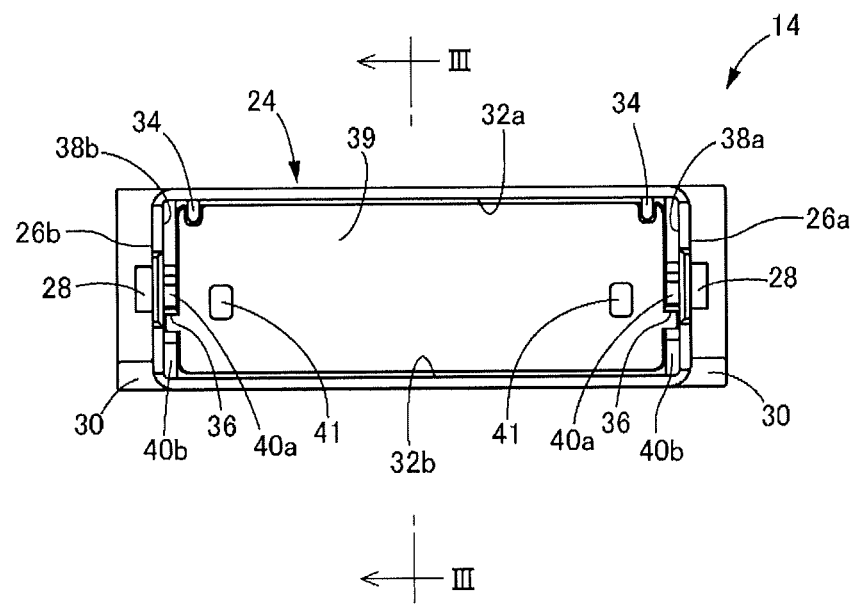
FIG. 2 is a front view of a case constituting the electrical connection box shown in FIG. 1.
Figure 3:
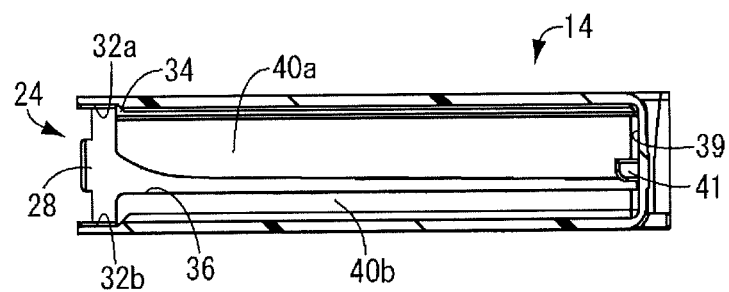
FIG. 3 is a cross-sectional view taken along in FIG. 2.

Also, as shown in FIGS. 2 and 3 as well, the case 14 is formed from synthetic resin and shaped as a box having an opening portion 24 shaped as an elongated rectangle. A pair of engaging protrusions 28 for engagement with the cover 16 are formed on the case 14, specifically on respective end edge portions on the opening portion 24 side of outer faces 26a and 26b located on the two sides in the longitudinal direction of the opening portion 24. Also, a pair of lower case ribs 30 serving as incorrect-connection-prevention projection portions are formed on lower end edge portions of the outer faces 26a and 26b, slightly rearward of the engaging protrusions 28. The lower case ribs 30 are shaped as rectangular blocks that project from the outer faces 26a and 26b. Furthermore, a pair of upper case ribs 34 serving as incorrect-connection-prevention projection portions are formed on the case 14, specifically on, out of inner faces 32a and 32b that extend in the longitudinal direction of the opening portion 24, the inner face 32a located on the upper side. The upper case ribs 34 are respectively located in the two end portions of the inner face 32a in the longitudinal direction of the opening portion 24 (the left-right direction in FIG. 2), project from the inner face 32a toward the other inner face 32b, and extend in a straight line toward the rear of the case 14 (to the right in FIG. 3). Note that the end portions of the upper case ribs 34 on the opening portion 24 side are located slightly inward in the case 14 relative to the opening portion 24.

Also, a pair of guide rails 36 are formed inside the case 14. The guide rails 36 are formed between thick portions 40a and 40b that project toward the interior of the case 14 from inner faces 38a and 38b of the case 14 that oppose each other in the longitudinal direction of the opening portion 24, and the guide rails 36 are located so as to oppose each other in the longitudinal direction of the opening portion 24. The guide rails 36 are shaped as grooves that are open toward the interior of the case 14 and extend in a straight line toward the rear of the case 14, and the end portions of the guide rails 36 on the opening portion 24 side are open to the outside of the case 14. Note that a pair of pressing projections 41 for preventing floating of the printed circuit board 12 inserted along the guide rails 36 are provided on a rear inner face 39 of the case 14.

Figure 4:
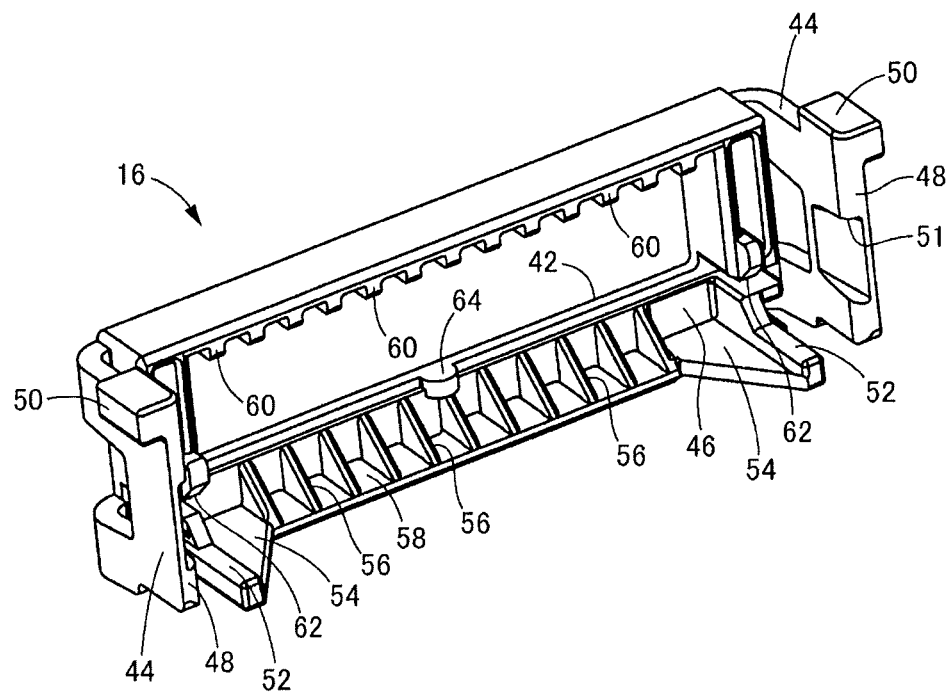
FIG. 4 is a perspective view of a cover constituting a part of the electrical connection box shown in FIG. 1.

Next, FIG. 4 shows the cover 16. The cover 16 is formed from synthetic resin and shaped as a frame having an elongated rectangle shape, and a through-hole 42 having a shape that corresponds to the connector 18 in a front view is formed in the center of the cover 16. A pair of frame-shaped lock pieces 44 are formed at the two end edges of the cover 16 in the longitudinal direction, and these lock pieces 44 project to the side of an inner face 46 of the cover 16. A pair of upper cover ribs 50 serving as incorrect-connection-prevention projection portions are formed on upper end portions of tip edge portions 48 of the lock pieces 44. The upper cover ribs 50 are shaped as rectangular blocks that project outward in the longitudinal direction of the cover 16 from the lock pieces 44. Note that a pair of tapered guiding portions 51 for guiding the engaging protrusions 28 of the case 14 are formed on the inner faces of the lock pieces 44 on the tip edge portion 48 side.

Also, a pair of lower cover ribs 52 serving as incorrect-connection-prevention projection portions are formed on the inner face 46 of the cover 16, specifically in the corner portions on the lower side of the two end portions in the longitudinal direction. The lower cover ribs 52 are shaped as columns that project rearward from the inner face 46 with an approximately rectangular cross-sectional shape. Note that the inner sides of the lower cover ribs 52 in the longitudinal direction of the cover 16 are respectively connected to a pair of reinforcing plate portions 54 that have an approximately triangular plate shape. Also, multiple lower reinforcing ribs 56 are formed between the reinforcing plate portions 54 on the inner face 46. The lower reinforcing ribs 56 are shaped as triangular plates that connect the inner face 46 and a lower plate 58 projecting perpendicularly from the inner face 46 between the reinforcing plate portions 54, and the lower reinforcing ribs 56 are arranged side-by-side with predetermined intervals in the longitudinal direction of the cover 16. Also, multiple upper reinforcing ribs 60 are formed on the inner peripheral face that is above the through-hole 42 and opposes the lower plate 58. The upper reinforcing ribs 60 are projections that project toward the interior of the cover 16 from the inner peripheral face above the through-hole 42 and extend in the front-back direction of the cover 16, and the upper reinforcing ribs 60 are arranged side-by-side with predetermined intervals in the longitudinal direction of the through-hole 42.

Furthermore, a pair of base plate insertion slits 62 that are shaped as slits open toward the rear of the cover 16 are formed in the cover 16 above the lower reinforcing ribs 56. Also, a positioning projection 64 that is approximately semicircular and projects toward the rear of the cover 16 is formed in the approximate center of the lower opening edge portion of the through-hole 42. The base plate insertion slits 62 and the positioning projection 64 are formed so as to be approximately collinear in the longitudinal direction of the cover 16, and the positioning projection 64 is formed in the approximately central portion between the base plate insertion slits 62.

As shown in FIG. 1 in which the printed circuit board 12, the case 14, and the cover 16 are included, the printed circuit board 12 is inserted through the opening portion 24 of the case 14. The printed circuit board 12 is inserted into the case 14 beginning with the end portion on the side opposite to the connector 18, and the two end edge portions in the width direction are inserted into and guided by the guide rails 36. Note that the end of insertion of the printed circuit board 12 into the case 14 is defined by the end portion on the side opposite to the connector 18 abutting against the rear inner face 39 of the case 14, and the connector 18 is positioned so as to slightly project from the case 14 at the end of insertion position.

Figure 5:
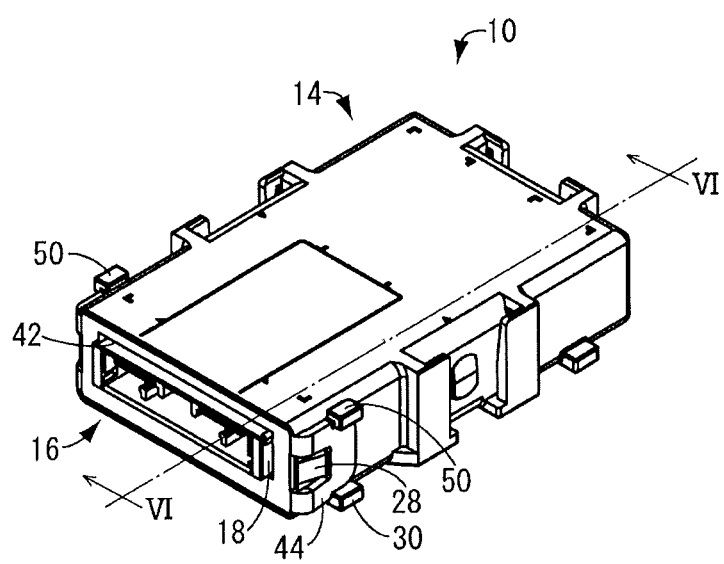
FIG. 5 is a perspective view of an assembled state of the electrical connection box shown in FIG. 1.
Figure 6:
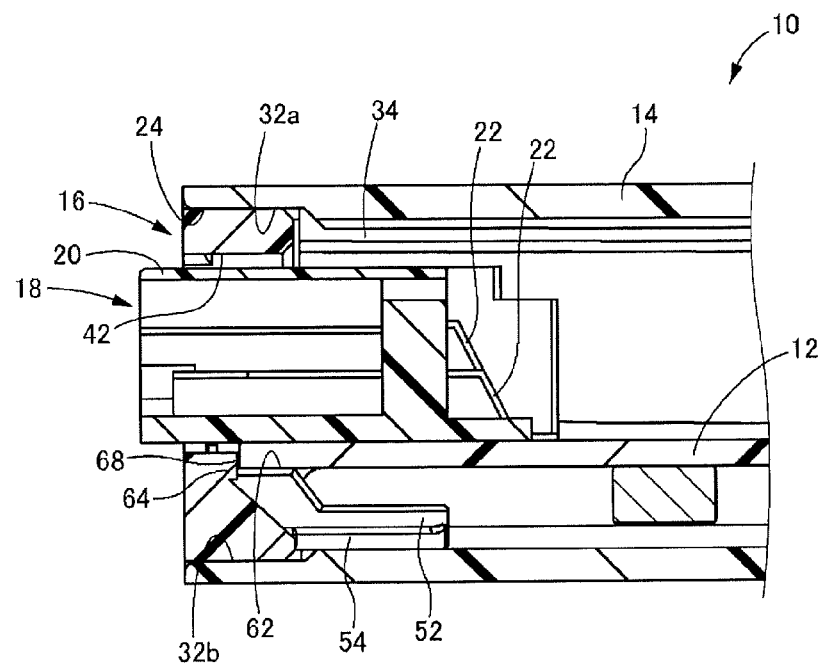
FIG. 6 is a cross-sectional view taken along VI-VI in FIG. 5.

Thereafter, the cover 16 is brought close to the case 14, and then when the guiding portions 51 provided on the inner faces of the tip edge portions 48 of the lock pieces 44 are fitted to the engaging protrusions 28 arranged on the outer faces 26a and 26b of the case 14, the cover 16 becomes positioned relative to the opening portion 24 of the case 14. At this time, the tip portions of the lower cover ribs 52 of the cover 16 have also been inserted and are in contact with the inner face 32b of the case 14. As the cover 16 is brought closer to the case 14 and the connector 18 is inserted into the through-hole 42 of the cover 16 in this state, the lock pieces 44 move over the engaging protrusions 28 while undergoing deformation so as to bend outward. The lock pieces 44 then undergo elastic restoration, and thus the lock pieces 44 become engaged with the engaging protrusions 28 of the case 14. Accordingly, the cover 16 is attached to the opening portion 24 of the case 14, and the opening portion 24 surrounding the connector 18 is covered by the cover 16. The electrical connection box 10 is assembled in this way as shown in FIGS. 5 and 6. Note that as is clearly shown in FIG. 5, the connector 18 passes through the through-hole 42 of the cover 16 and slightly projects from the cover 16, and thus work space for the insertion and removal of a partner connector is ensured.

Also, the lower reinforcing ribs 56 of the cover 16 are inserted into the case 14. The end portion of the printed circuit board 12 on the connector 18 side is inserted into the base plate insertion slits 62 provided above the lower reinforcing ribs 56, and as shown in FIG. 6, the positioning projection 64 of the cover 16 is inserted into a semi-circular positioning notch 68 formed in the end edge portion of the printed circuit board 12 on the connector 18 side. The end portion of the printed circuit board 12 on the connector 18 side is thus supported in a state of being positioned by the cover 16.

A surface mount-type connector is used as the connector 18 in the electrical connection box 10 having the above structure. This makes it possible to eliminate the need for bolts for fixing the connector 18 to the printed circuit board 12, thus reducing the number of parts, and also makes it possible to eliminate the need for man-hours for bolt tightening and thus reduce the number of man-hours. This enables a reduction in manufacturing cost.

Figure 7:
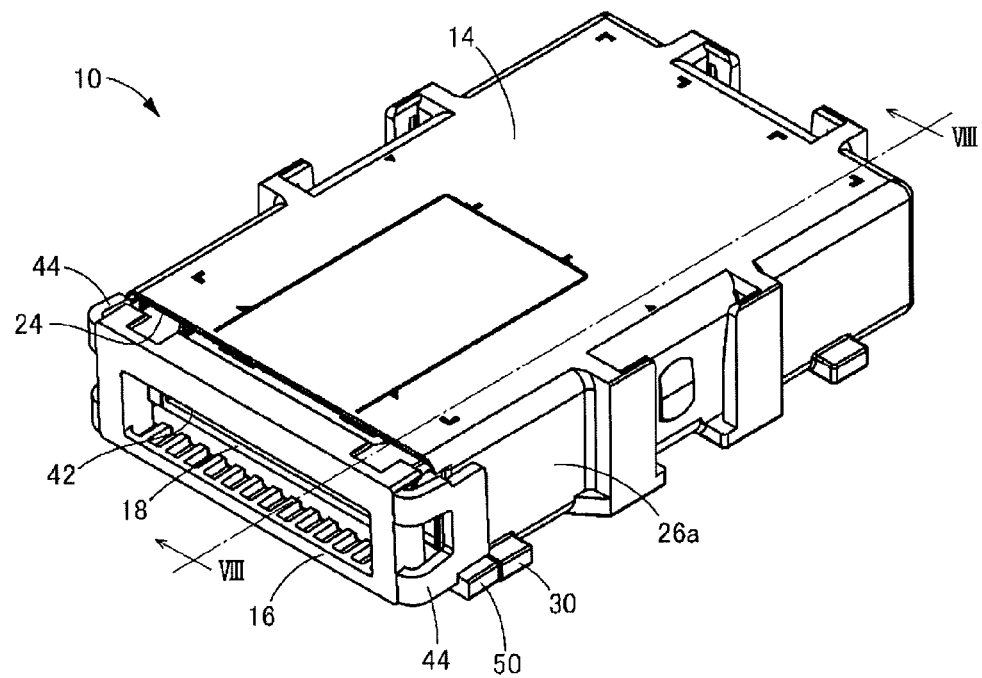
FIG. 7 is a perspective view of an assembled state in which the cover of the electrical connection box shown in FIG. 1 is upside down.
Figure 8:
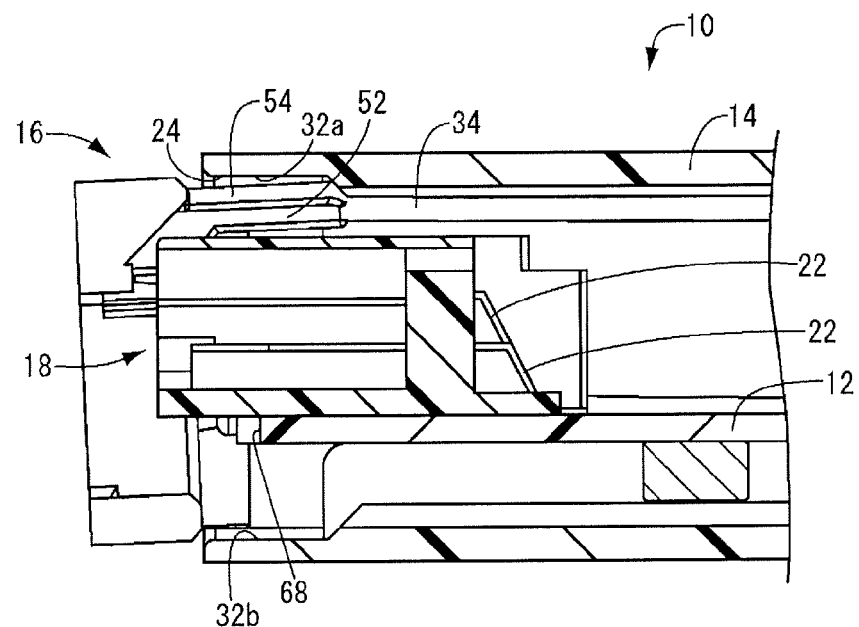
FIG. 8 is a cross-sectional view taken along VIII-VIII in FIG. 7.

According to the electrical connection box 10 of the present embodiment, as shown in FIGS. 7 and 8, if during the attachment of the cover 16 to the case 14, the cover 16 is brought close to the case 14 upside down relative to the proper orientation, then before the cover 16 abuts against the connector 18, the upper cover ribs 50 will abut against the lower case ribs 30 outside the case 14, and the lower cover ribs 52 will abut against the upper case ribs 34 inside the case 14, and thus incorrect attachment of the cover 16 to the case 14 will be inhibited. Collision of the cover 16 with the connector 18 is thus inhibited, thereby making it possible to prevent the portion where the connection terminals 22 of the connector 18 are soldered from being subjected to a load.

In other words, according to the electrical connection box 10 of the present embodiment, it is possible to reliably prevent collision between the cover 16 and the connector 18 due to incorrect attachment of the cover 16, thus making it possible to reliably protect the connector 18 without the connector 18 being fixed to the printed circuit board 12 by bolts or the like. As a result, for the first time it is possible for a surface mount-type connector 18 to be employed in an electrical connection box 10 having a structure in which the printed circuit board 12 is inserted into the case 14 and then the cover 16 is attached, and it is possible to achieve downsizing and a reduction in manufacturing cost. Note that as is clear from the above description, in the present embodiment, the upper case ribs 34, the lower case ribs 30, the upper cover ribs 50, and the lower cover ribs 52 constitute incorrect-connection-prevention projection portions that prevent incorrect attachment of the cover 16 by abutting against each other before the cover 16 abuts against the connector 18.

In particular, in the present embodiment, when the upper case ribs 34 and the lower cover ribs 52 abut against each other on the upper side of the connector 18, and the lower case ribs 30 and the upper cover ribs 50 abut against each other on the lower side, the approach of the cover 16 can be inhibited on both the upper and lower sides of the connector 18, and collision between the cover 16 and the connector 18 can be effectively inhibited. In other words, the set of upper case ribs 34 and lower case ribs 30 and the set of lower cover ribs 52 and upper cover ribs 50 that function as incorrect-connection-prevention projection portions are respectively provided on the case 14 and the cover 16, specifically on the upper and lower sides with the connector 18 therebetween. Also, since the upper cover ribs 50 are provided on the lock pieces 44 of the cover 16, if the cover 16 is upside down, the upper cover ribs 50 will abut against the lower case ribs 30, thus making it possible to effectively inhibit the movement of the lock pieces 44, and to reliably inhibit engagement of the lock pieces 44 and the engaging protrusions 28.

Also, the upper case ribs 34 and the lower cover ribs 52 that function as incorrect-connection-prevention projection portions above the connector 18 are arranged on the inner side of the case 14, and the lower case ribs 30 and the upper cover ribs 50 that function as incorrect-connection-prevention projection portions below the connector 18 are arranged on the outer side of the case 14. Accordingly, when the cover 16 is in the properly attached state, interference between the upper case ribs 34 and the upper cover ribs 50 and interference between the lower case ribs 30 and the lower cover ribs 52 are reliably inhibited inside and outside the case 14, and the cover 16 can be smoothly and easily attached to the case 14.

Figure 9:
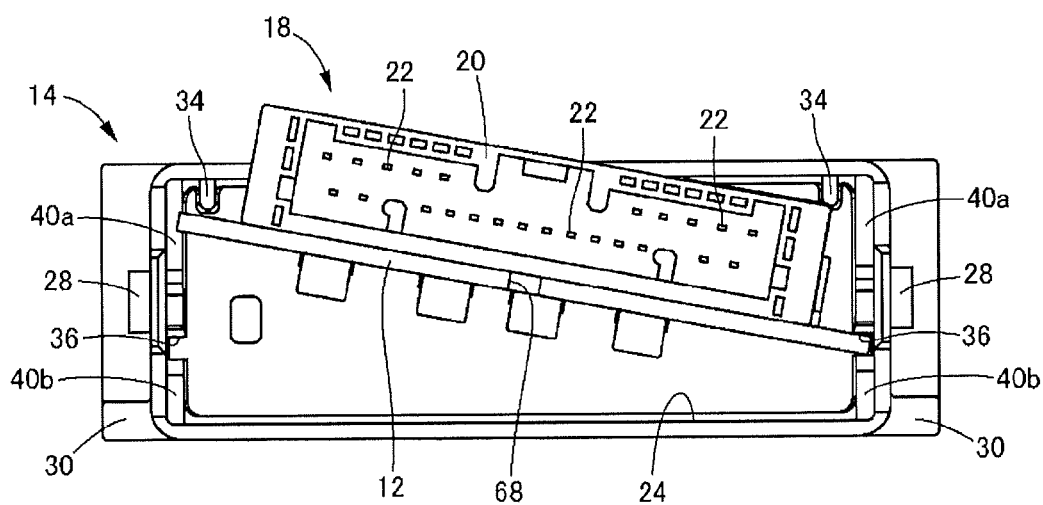
FIG. 9 is a front view showing a state in which inclined insertion of the printed circuit board into the case of the electrical connection box shown in FIG. 1 is prevented by incorrect-connection-prevention projection portions.

Furthermore, due to the upper case ribs 34 being formed on the inner side of the case 14, if an attempt is made to insert the printed circuit board 12 into the case 14 at an inclination as shown in FIG. 9, the end edge portion of the printed circuit board 12 on the side opposite to the connector 18 will abut against either an upper case rib 34 or a thick portion 40a or 40b. Specifically, if the printed circuit board 12 has a low inclination so as to not abut against the upper case ribs 34, it will abut against the thick portion 40a or 40b as shown in FIG. 9. However, if the inclination of the printed circuit board 12 is high, it will abut against an upper case rib 34. It is thus possible to prevent the printed circuit board 12 from being inserted into the case 14 in an inclined state, and it is also possible to prevent collision between the connector 18 and the opening portion 24 of the case 14 if the printed circuit board 12 is inserted at an inclination.

Although an embodiment has been described in detail above, the present invention is not limited to this specific description. The incorrect-connection-prevention projection portions may be formed at any location on the case 14 and the cover 16 as long as it is possible to prevent incorrect attachment by abutting against each other before the cover 16 abuts against the connector 18 at an improper attachment position. Accordingly, the locations can be appropriately set according to the shapes of the connector 18 and the opening portion 24 of the case 14, for example, and the shapes and number of ribs on the case 14 side and the cover 16 side that function as the incorrect-connection-prevention projection portions are also set appropriately.

Specifically, if there is insufficient space for providing incorrect-connection-prevention projection portions on the inner side of the case 14, the effect of preventing incorrect attachment can be advantageously exhibited even if only the lower case ribs 30 and the upper cover ribs 50 arranged on the outer side of the case 14 are provided. Similarly, if sufficient space cannot be ensured on the outer side of the case 14, the effect of preventing incorrect attachment can be obtained even if only the upper case ribs 34 and the lower cover ribs 52 are provided.

What is claimed is:

1. An electrical connection box comprising:
a printed circuit board provided with a lateral connection-type connector inserted through an opening portion of a case and housed in the case,
a cover attached to the opening portion of the case, the lateral connection-type connector projecting outside the case through a through-hole formed in the cover,
a surface mount-type connector being provided on the printed circuit board as the lateral connection-type connector, and
the case and the cover being provided with incorrect-connection-prevention projection portions that, when the cover is brought close to the case upside down relative to a proper orientation, prevent incorrect attachment of the cover by abutting against each other before the cover abuts against the connector.

2. The electrical connection box according to claim 1, wherein the incorrect-connection-prevention projection portion provided on the cover is formed on a lock piece of the cover for engagement with an engaging protrusion protruding on an outer face of the case.

3. The electrical connection box according to claim 1, wherein insertion of the printed circuit board in an inclined state is prevented by the incorrect-connection-prevention projection portion provided on an inner face of the case.

4. The electrical connection box according to claim 3, wherein the incorrect-connection-prevention projection portion provided on the cover is formed on a lock piece of the cover for engagement with an engaging protrusion protruding on an outer face of the case.

5. The electrical connection box according to claim 1, wherein the incorrect-connection-prevention projection portions are respectively provided on the case and the cover on upper and lower sides with the surface mount-type connector therebetween.

6. The electrical connection box according to claim 5, wherein the incorrect-connection-prevention projection portion provided on the cover is formed on a lock piece of the cover for engagement with an engaging protrusion protruding on an outer face of the case.

7. The electrical connection box according to claim 5, wherein insertion of the printed circuit board in an inclined state is prevented by the incorrect-connection-prevention projection portion provided on an inner face of the case.

8. The electrical connection box according to claim 7, wherein the incorrect-connection-prevention projection portion provided on the cover is formed on a lock piece of the cover for engagement with an engaging protrusion protruding on an outer face of the case.

9. The electrical connection box according to claim 5, wherein the incorrect-connection-prevention projection portion located on the upper side of the connector is formed on one of an inner face and an outer face of the case, and the incorrect-connection-prevention projection portion located on the lower side of the surface mount-type connector is formed on the other one of the inner face and the outer face of the case.

10. The electrical connection box according to claim 9, wherein the incorrect-connection-prevention projection portion provided on the cover is formed on a lock piece of the cover for engagement with an engaging protrusion protruding on an outer face of the case.

11. The electrical connection box according to claim 9, wherein insertion of the printed circuit board in an inclined state is prevented by the incorrect-connection-prevention projection portion provided on an inner face of the case.

12. The electrical connection box according to claim 11, wherein the incorrect-connection-prevention projection portion provided on the cover is formed on a lock piece of the cover for engagement with an engaging protrusion protruding on an outer face of the case.

\* \* \* \* \*